(12) United States Patent
Fan et al.

(10) Patent No.: US 7,535,028 B2
(45) Date of Patent: May 19, 2009

(54) MICRO-LED BASED HIGH VOLTAGE AC/DC INDICATOR LAMP

(75) Inventors: Zhaoyang Fan, Manhattan, KS (US); Hongxing Jiang, Manhattan, KS (US); Jingyu Lin, Manhattan, KS (US)

(73) Assignee: AC LED Lighting, L.LC., Manhattan, KS (US)

( * ) Notice: Subject to any disclaimer, the term of this patent is extended or adjusted under 35 U.S.C. 154(b) by 0 days.

(21) Appl. No.: 11/102,273

(22) Filed: Apr. 8, 2005

(65) Prior Publication Data
US 2006/0169993 A1    Aug. 3, 2006

Related U.S. Application Data

(60) Provisional application No. 60/649,827, filed on Feb. 3, 2005.

(51) Int. Cl.
*H01L 33/00* (2006.01)

(52) U.S. Cl. .............................. 257/88; 257/89; 257/99; 257/E25.02

(58) Field of Classification Search ............. 257/88–89, 257/99; 438/22, 25
See application file for complete search history.

(56) References Cited

U.S. PATENT DOCUMENTS

| | | |
|---|---|---|
| 3,900,863 A | 8/1975 | Kim |
| 5,278,432 A | 1/1994 | Ignatius et al. |
| 5,317,170 A | 5/1994 | Paoli |
| 5,563,422 A | 10/1996 | Nakamura et al. |
| 5,652,434 A | 7/1997 | Nakamura et al. |
| 5,699,073 A | 12/1997 | Lebby et al. |
| 5,767,581 A | 6/1998 | Nakamura et al. |
| 5,773,130 A | 6/1998 | So et al. |
| 5,877,558 A | 3/1999 | Nakamura et al. |
| 5,929,466 A * | 7/1999 | Ohba et al. .................. 257/103 |
| 5,952,680 A | 9/1999 | Strite |
| 5,955,748 A | 9/1999 | Nakamura et al. |
| 5,966,393 A | 10/1999 | Hide et al. |
| 6,054,724 A | 4/2000 | Ogihara et al. |
| 6,093,965 A | 7/2000 | Nakamura et al. |
| 6,410,940 B1 | 6/2002 | Jiang et al. |
| 6,410,942 B1 * | 6/2002 | Thibeault et al. .............. 257/88 |

(Continued)

FOREIGN PATENT DOCUMENTS

JP          5-63233       *    3/1993

(Continued)

OTHER PUBLICATIONS

Jeon, "A novel fabrication method for a 64 x 64 matrix addressable GaN-based micro-LED array," phys. stat. Sol. (a) 200, No. 1, 79-82 (2003).*

(Continued)

*Primary Examiner*—A. Sefer
(74) *Attorney, Agent, or Firm*—Lathrop & Gage LLP

(57) ABSTRACT

An AC/DC indicator lamp based on an array of micro-LEDs may be powered by a standard high voltage AC or DC power source. The indicator lamp has a low power consumption. The micro-LEDs are serially connected on a substrate with the total device area and power consumption compatible with a standard DC low voltage LED. A plurality of indicator lamps may be connected together in parallel to present a string of indicator lamps.

24 Claims, 2 Drawing Sheets

U.S. PATENT DOCUMENTS

| | | | |
|---|---|---|---|
| 6,455,878 B1 | 9/2002 | Bhat et al. | |
| 6,461,019 B1 | 10/2002 | Allen | |
| 6,547,249 B2 | 4/2003 | Collins et al. | |
| 6,635,902 B1* | 10/2003 | Lin | 257/88 |
| 6,740,960 B1 | 5/2004 | Farnworth et al. | |
| 6,936,855 B1 | 8/2005 | Harrah | |
| 6,957,899 B2 | 10/2005 | Jiang et al. | |
| 7,045,965 B2* | 5/2006 | Li et al. | 315/185 S |
| 7,210,819 B2 | 5/2007 | Jiang et al. | |
| 7,213,942 B2 | 5/2007 | Jiang et al. | |
| 7,221,044 B2 | 5/2007 | Fan et al. | |
| 2002/0006040 A1 | 1/2002 | Kameda et al. | |
| 2002/0043943 A1 | 4/2002 | Menzer et al. | |
| 2003/0160258 A1* | 8/2003 | Oohata | 257/99 |
| 2004/0080941 A1* | 4/2004 | Jiang et al. | 362/252 |
| 2004/0129946 A1* | 7/2004 | Nagai et al. | 257/98 |
| 2004/0206970 A1* | 10/2004 | Martin | 257/98 |
| 2004/0223342 A1* | 11/2004 | Klipstein et al. | 362/555 |
| 2005/0127816 A1* | 6/2005 | Sumitani | 313/498 |
| 2005/0253151 A1 | 11/2005 | Sakai et al. | |
| 2005/0254243 A1* | 11/2005 | Jiang et al. | 362/249 |
| 2006/0044864 A1* | 3/2006 | Lin et al. | 365/151 |
| 2006/0180818 A1* | 8/2006 | Nagai et al. | 257/89 |
| 2006/0208264 A1* | 9/2006 | Ryu et al. | 257/86 |

FOREIGN PATENT DOCUMENTS

JP  2004-006582  8/2002

OTHER PUBLICATIONS

Hongxing Jiang and Jingyu Lin, "On Display", article from OE magazine Jul. 2001.

H.X. Jiang and J.Y. Lin, "Advances in III-nitride micro-size light emitters", article from The Advanced Semiconductor magazine, vol. 14, No. 5.

C.H. Chen, H.J. Chang, Y.F. Chen, W.S. Fann, H.X. Jiang and J.Y. Lin, "Mechanism of photoluminescence in GaN/Al (0.2)Ga(0.8)N superlattices", Applied Physics Letters, vol. 79, No. 23, Dec. 3, 2001.

Dr. Jing Li, "III-Nitride Integrated Photonic Devices", undated.

"Kansas State Researchers Fabricate Blue Micro Light-Emitting Diodes, Paving Way for Microdisplays, Energy-Saving Lighting", Ascribe The Public Interest Newswire, Sep. 27, 2001.

S X Jin, J Li, J Y Lin and H X Jiang, InGaN/GaN Quantum Well Interconnected Microdisk Light Emitting Diodes; Applied Physics Letters, vol. 77, No. 20, p. 3236-3238, Nov. 13, 2000.

Mair et al., Optical properties of GaN/AlGaN multiple quantum well microdisks, Nov. 17, 1997, Appl. Phys, Lett. 76 (5) p. 631, American Institute of Physics.

Zhaoyang Fan, Hongxing Jiang, Jingyu Lin; Related and Copending U.S. Appl. No. 11/144,982, filed Jun. 3, 2005.

Zhaoyang Fan; Related and Copending U.S. Appl. No. 11/340,296, Filed Jan. 26, 2006.

* cited by examiner

MICRO-LED BASED HIGH VOLTAGE AC/DC INDICATOR LAMP

CROSS-REFERENCE TO RELATED APPLICATION

The present application claims the benefit of provisional application Ser. No. 60/649,827, filed Feb. 3, 2005, which is hereby incorporated into the present application by reference.

STATEMENT REGARDING FEDERALLY SPONSORED RESEARCH OR DEVELOPMENT

This invention was made in part with the support of the U.S. Government: the U.S. Government has certain rights in this invention as provided for by the terms of Grant DMI-0450314 awarded by the National Science Foundation.

FIELD OF THE INVENTION

The present invention relates to a light emitting diode (LED), and more particularly, to an indicator lamp, which includes serially interconnected micro-size LEDs (Micro-LEDs) integrated on a single chip. The resulting indicator lamp may be directly powered by an AC voltage (i.e., 110/120V or 220/240V power grid) or a high DC voltage without a power transformer.

BACKGROUND OF THE INVENTION

Tiny LED indicator lamps have been widely used in electronics, toys, decorations and displays. These standard or conventional LEDs based on AlInGaN or AlInGaP have a typical chip area (or die size) of approximately 0.3 mm by 0.3 mm. These LED lamps typically operate with a DC current of 20 milliamps and a corresponding DC voltage between 2 volts and 4 volts, depending on the LED semiconductor materials. The standard indicator lamp with a T1 or T1-¾ package may have a maximum input power of about 0.1 watt.

Although the intrinsic low voltage and DC current nature of the standard LED lamp makes it very convenient to be incorporated in electronics design, it may also be an inconvenience in other applications. For example, in order to use these standard indicator lamps for Christmas tree decorations, the LED-based light strings must employ parallel wiring of individual LEDs, a bulky step-down transformer and rectifier conversion scheme. LED light strings may also employ serial wiring of individual LED lamps with the number of LED lamps dependant on the AC supply voltage. In the serially connected string, the number of LED lamps cannot easily be changed, and further, if one lamp fails and leads to an open circuit, the entire string will not work.

A standard-size LED array may be integrated on the same substrate with a total device size from around 1 mm by 1 mm to 2 mm by 2 mm or even larger for 120 VAC supply. The device runs under a current of approximately 20 mA or higher to achieve a high brightness for applications such as household lighting purpose. Such an AC-LED needs special packaging and heat dissipation scheme because of the relatively large chip size and high thermal production, which is not compatible with packaging requirements of low power indicator lamps. These power AC-LEDs are not suitable to replace the standard tiny LED indicator lamps.

In U.S. Pat. No. 6,410,940, a micro-size LED (micro-LED) array is disclosed, which is arranged in matrix format to be individually addressed for applications such as a micro-size display, or the array may be arranged in a parallel format to enhance the light output compared with the standard broad area LED. Basically, these micro-LED arrays still work under a low DC voltage (several volts) with a typical current level of tens of mA.

An individual micro-LED has a typical size of hundreds times smaller than the standard LED, and its area is even smaller than the contacts area of the standard LED, therefore, the device geometry layout design and fabrication process are considerably different from each other. The micro-LED array for high voltage AC/DC application is also different from that of the standard-size LED array. A need remains for a micro-size light emitting diode array, which may be powered by standard high voltage AC/DC power and may be used to replace the conventional low DC voltage indicator lamps.

SUMMARY OF THE INVENTION

The present invention provides a micro-LED array which is serially interconnected with two outlet leads for connection with a high voltage AC/DC power supply. The array has a comparable total chip size and power consumption to those of the conventional LED indicator lamps, so that the micro-LED array may be directly packaged in a housing used for a standard LED indicator lamp. The result is a high voltage AC/DC indicator lamp with the same or similar outside physical features as the standard LED indicator lamp. Depending on the detailed design, the supplied power to the high voltage AC/DC indictor lamp may be 12 volts, 24 volts, 36 volts, 48 volts, and other DC voltages, or it may be an AC voltage such as 110/120 volts or 220/240 volts.

A conventional LED indicator lamp may be replaced with an array of micro-LEDs connected in a serial mode, that is the p-contact (anode) of one micro-LED is connected with the n-contact (cathode) of its neighboring micro-LED, the result is that the applied voltage to the array equals to the sum of the voltage drop on each micro-LED. If each micro-LED works under 3 volts, for example, then for a 120V power supply, the array will have 40 serially connected micro-LEDs. Since the diode has current flow and light emission only when the voltage drop between its anode and cathode is positive, for an AC power supply, the above array will only have light emission in the positive half cycle of the AC power. A second array may be used, which is connected in parallel with the first array, but this second array is arranged to have a reversed current flow direction, so that in each half cycle, there is one array emitting light. In this scheme, a conventional LED with a size 0.3 mm by 0.3 mm may be replaced by an array consisting of 80 micro-LEDs with a size of less than 25 μm by 25 μm, considering that extra space is required for isolation and interconnection.

The micro-LED array may be integrated on the same substrate, and the isolation between each micro-LED is accomplished through trench etching to remove the conductive materials down to the insulating substrate, or to an insulating layer sandwiched between the micro-LED structure and the conductive or insulting substrate. This insulating layer may be epitaxially grown on the substrate and its composition and thickness should be selected so that the subsequent micro-LED material structure is thin enough (less than 2.5 μm, for example), to ensure that the isolation trench etching and the metalization interconnection between the neighboring micro-LEDs may be easily accomplished. Another approach based on surface planarization with spin-on polymers or deposited insulators is also presented.

The integrated micro-LED array with a size comparable to the standard DC LED indicators, may have a similar package as the standard indictor lamp, and have similar power consumption. Since the input voltage is much higher, the indictor lamp in this invention runs under a current much smaller than the standard indicator lamp. For a 120 VAC design, the indicator lamp may be directly run with the standard household power. Many indicator lamps may be connected in parallel to construct an LED string with high reliability.

DETAILED DESCRIPTION

Figure 1:
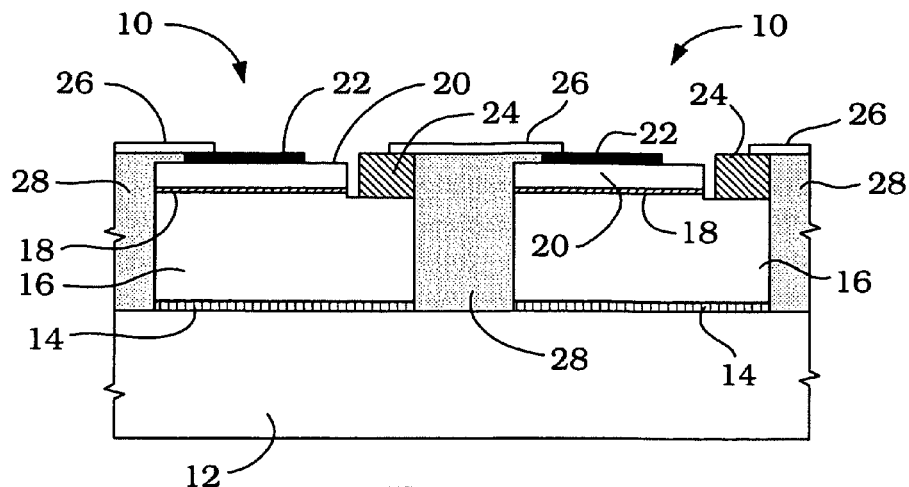
FIG. 1 is an enlarged cross sectional view of a micro-LED based AC/DC indicator lamp with polymer planarization.

Referring to FIG. 1, an embodiment of a micro-LED of the present invention based on AlInGaN semiconductor materials is generally indicated by reference numeral 10. Micro-LED 10 may be grown on an insulating sapphire substrate 12 and include a buffer layer 14, n-type semiconductor layer 16, an activation region layer 18 and a p-type semiconductor layer 20. For 120 VAC applications, each micro-LED 10 may have dimensions of approximately 25 µm by 25 µm or similar size, formed by plasma etching down to the insulating substrate 12. A p-contact (anode) 22 and an n-contact (cathode) 24 are formed on the p-type layer 20 and n-type layer 16 separately. A current spreading layer used for the standard broad area LED is generally not required for the micro-LED 10 of the present invention because of the very small size of micro-LED, although its incorporation is also an option.

The anode and cathode are formed by depositing different metals and then thermally annealing in a different temperature and ambient environment. For example, the anode is formed by a Ni and Au metal stack annealed in an oxygen-containing environment, while the cathode is formed by a Ti and Al metal stack annealed in a nitrogen environment. To reduce the number of manufacture steps, a tunneling junction consisting of heavily doped n$^+$ semiconductor and p$^+$ semiconductor layers on the p-type semiconductor layer 20 may also be used. In this case, both the anode and cathode are formed in the same process step by the same Ti and Al metal stack on the n$^+$ and n semiconductors respectively.

An interconnection 26 between the neighboring micro-LEDs 10 may be accomplished in different ways. Preferably, the interconnection 26 is accomplished by a surface planarization, followed by metallization. A visible-light transparent, but deep ultraviolet (DUV) photon definable polymer 28 may be applied on the uneven surface of the micro-LEDs 10 by spin-coating. Then with DUV photolithography, part of the polymer 28 is removed to achieve a quasi-flat surface with the p-type 22 and n-type 24 contacts exposed, followed with thermal curing to form hard polymide. With surface planarization, the metal deposition for interconnection 26 may be easily accomplished. The polymer 28 also has the function to passivate the surface and etched side-walls of the micro-LEDs 10 to diminish the non-emission recombination rate and improve the device reliability. By selection of a polymer 28 with a high refractive index, light extraction from the device 10 may be enhanced. A substitute material which may be used for the polymer is an insulating dielectric material such as different oxides or nitrides materials. For example, thick silicon oxides or silicon nitrides may be deposited into the deep trench between micro-LEDs, so the trench can be filled up to achieve a quasi-flat surface.

Figure 2:
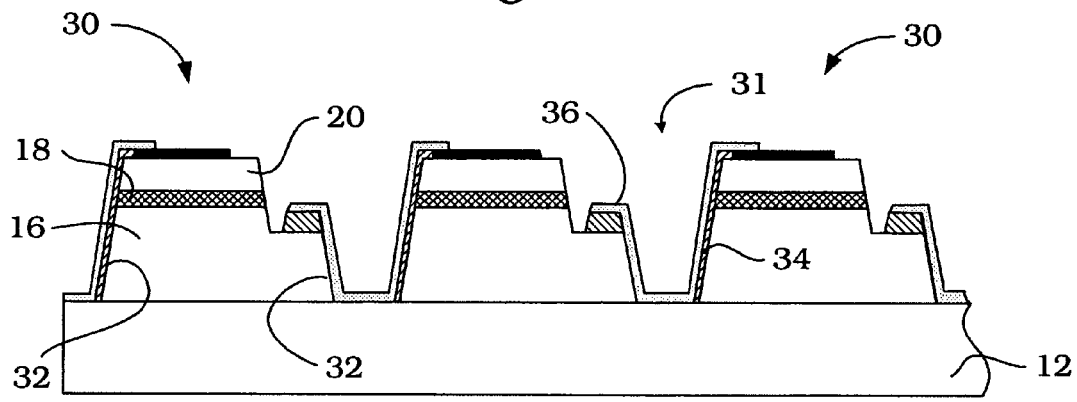
FIG. 2 is an enlarged sectional view of a micro-LED AC/DC indicator lamp with sloped side walls.

Referring to FIG. 2, a micro-LED which does not incorporate the surface planarization step described hereinabove, is generally indicated by reference numeral 30. The isolation of the micro-LEDs 30 is accomplished by etching a trench 31 to the insulating substrate 12 with an quasi-isotropic plasma etch so that the sidewalls 32 have a slope with an angle, generally between 40° and 80°. With the sloped sidewalls, a thin layer of insulating dielectric materials 34 may be deposited followed with the interconnection metal wire 36. The insulating material 34, which maybe silicon oxide, silicon nitride, or other insulators, isolates the metal wire 36 from the semiconductor sidewalls 32, and passivates the dangling bonds on the sidewalls The sloped sidewalls 32 reduce the effective area of the micro-LED 30. However, with the sloped sidewall profile, the insulating material 34 and the interconnecting metal wire 36 can be conformably deposited with a uniform thickness on the flat surface and on the sidewall; further, the sloped sidewalls 32 enhance the light extraction from the micro-LEDs 30. Because semiconductors typically have a large index of refraction, most of the generated light is trapped in the semiconductors forming a guided wave, which cannot escape. With the sloped profile, the guided light waves have more opportunity to escape from the sidewalls 32 at the areas without metal wire 36. Note on the sidewalls, only a small potion is covered with the interconnection metal wire 36. The result is the micro-LED array 30 has more light efficiency.

Figure 3:
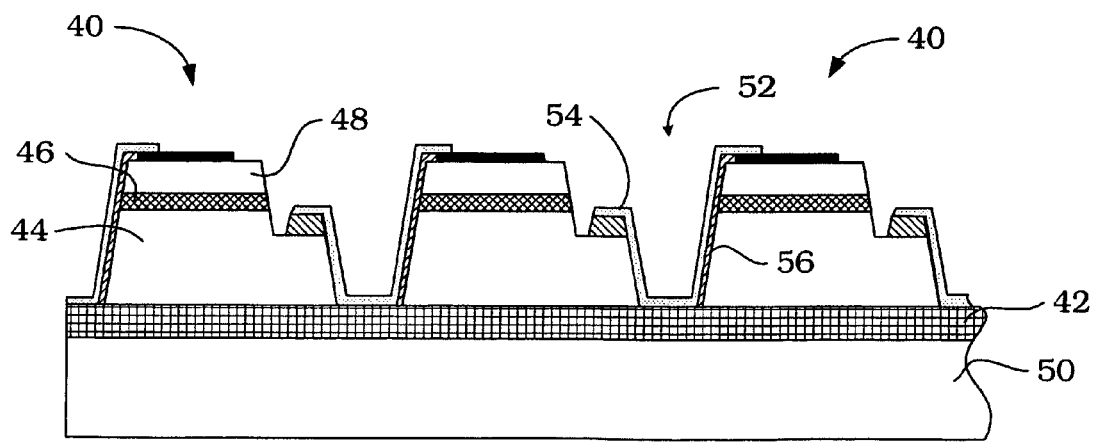
FIG. 3 is an enlarged cross sectional view of a micro-LED based AC/DC indicator lamp on a conductive substrate with an insulation epitaxial layer and a thin LED structure.

Referring to FIG. 3, another embodiment of the micro-LED of the present invention based on AlInGaN semiconductor materials is generally indicated by reference numeral 40. Micro-LED 40 may be grown on different substrates 42 such as silicon carbide (SiC), silicon (Si), gallium nitride (GaN), aluminum nitride (AlN), gallium arsenide (GaAs), indium phosphide (InP) and sapphire (Al$_2$O$_3$), for example. Without the typical low temperature buffer layer, the semiconductor growth starts from high temperature grown AlN with high resistivity. Other semiconductors such as AlGaN and AlInGaN may also be used. This insulating layer gradually transits to the n-type GaN semiconductor layer 44 by changing AlGaN or AlInGaN alloy composition. Next the activation layer 46 is grown followed by the p-type semiconductor layer 48. A tunneling junction consisting of heavily doped n$^+$ semiconductor and p$^+$ semiconductor layers on the p-type semiconductor layer 48 may also be included, so the anode and cathode can be formed in one step.

Without sacrificing the final device performance, the micro-LED structure layers 44, 46 and 48 (not include the insulating layer) are very thin, for example, less than 2.5 µm, instead of the typical thickness of more than 5 µm. The benefits of this thin structure plus the resistive layer 42 are that conductive or semi-conductive substrates 50, such as SiC, Si, GaN, GaAs and InP, for example, may also be used for the high voltage AC/DC indicator lamp 40. Furthermore, an isolation trench 52 may be only etched to the deposited insulating layer 42 with an quasi-isotropic etch, so the trench depth is shallow and with an inclination slope, and a conformal interconnection metallization wire 54 and a dielectric isolation layer 56 applied to the sidewalls may be easily formed without additional complex processing steps. The isolation layer 56 may consist of silicon oxide, silicon nitride, other oxide, nitride, or polymide, for example.

Figure 4:
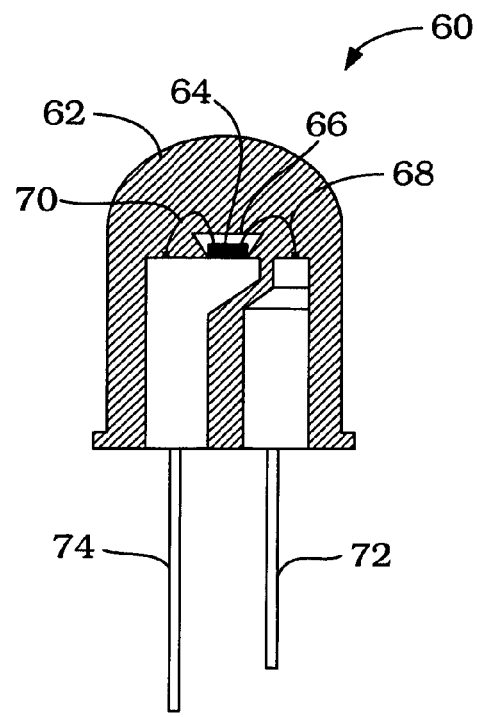
FIG. 4 is an enlarged cross sectional view of a packaging of a micro-LED based AC/DC indicator lamp.
Figure 5:
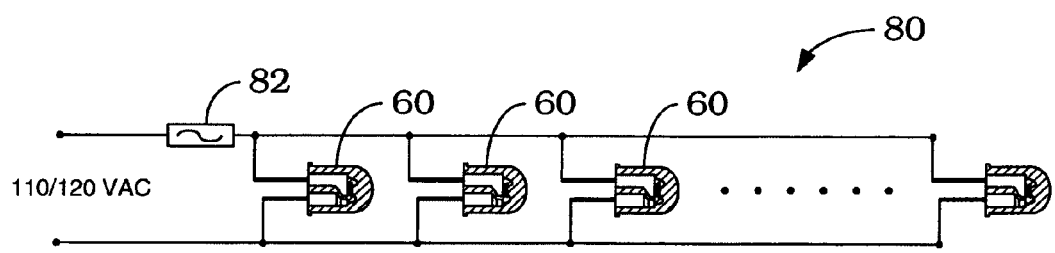
FIG. 5 is an illustration of a parallel micro-LED based AC lamp string.

Referring to FIG. 4, a device packaging 60 may include standard 3 mm, 5 mm, 10 mm, or other diameter lens sizes, known as T1, T1-¾, and T3-¼ package respectively. These are the packages which have been used for the standard LED indictor lamps. The device packaging 60 includes the epoxy lens or dome 62, a micro-LED array 64, a reflector cup 66, wire bonds 68 and 70, and two metal leads 72 and 74. The thermal dissipation of these packages 60 is through the two thin metal leads 72 and 74, leading to a high thermal resistance and limited thermal dissipation ability. Such a package has a maximum input power of around 0.1 W, or a maximum current of less than around 1 mA for a 120 VAC indictor lamp. Considering that the standard 0.3 mm×0.3 mm LED indicator lamp running under a current 20 mA with a current density of 22 $A/cm^2$, each micro-LED with an area of 25 μm×25 μm should run under a current density of 44 $A/cm^2$, or a current 0.3 mA. Even considering there are two micro-LED arrays 64 connected in parallel and conducting in opposite directions, the total input power of the 120 VAC indicator lamp is still less than the maximum limitation, ensuring its reliability without over heating.

The indicator lamp 60 emits a light wavelength depending on the bandgap energy of the semiconductor at the device active region. For example, if InGaN is used at the active region, by changing indium composition in the InGaN alloy to change the bandgap energy, it can emit a light covering ultra-violet (UV), blue and green wavelength range. To achieve white light, phosphors may be used for color conversion. For example, Yttrium Aluminate yellow phosphor can absorb blue light and emit yellow light. After wire bonding, a phosphors slurry can be filled in the cup 66, followed with encapsulation 62. If micro-LED array 64 emits blue light and yellow phosphor is incorporated, the combination of the transmitted blue light from micro-LED array and the yellow light from the phosphor will produce white color.

Surface mounted packages may also be used for housing the micro-LED array. Furthermore, with a larger housing chamber, several micro-LED arrays with red, green, and blue colors fabricated from different semiconductors can be packaged in the same housing. With the red, green, and blue color mixing, a high voltage AC/DC white emitter is achieved.

The AC indicator lamp 60 may be easily used for indication and signaling purposes with a direct connection to the 110V/120V power supply. As an example, almost every machine or instrument powered by electricity incorporates a conventional LED beside (or inside) the power switch to indicate if the power is on. This standard indicator LED has to be driven by a low DC voltage. If the AC indicator 60 is substituted for the conventional LED, it will be directly driven by the 110V/120V power without extra circuit. As another example for Christmas tree decorations, a parallel AC-LED lamp string may be constructed generally indicated by reference numeral 80, as illustrated in FIG. 4. Since each lamp 60 runs with a current of approximately 1 mA, there is almost no limitation on the number of lamps connected in the string 80, and the string may be directly plugged into the house-hold AC power supply without any transformer or rectifier. For safety reasons, a fuse 82 may be serially connected with the lamp string 80 for over-current protection in case some lamps are destroyed and form a short circuit. In that case, the shorted lamp may be removed, and the fuse 82 replaced with a new fuse. If a bad lamp or a loose connection causes an open circuit, the parallel lamp string 80 will still work without any replacement. To avoid the damage caused by the power surge in the power grid, a varistor (not shown) may be connected between the terminals of the power supply. If a power surge occurs, the varistor is trigged and the surge current will by-passed by the varistor to protect the indicator lamps 60.

Although an InGaAlN semiconductor emitter is used as examples in the invention description, it should be understood that a AC/DC light emitting device based on other semiconductor materials such as GaAs, InP, may be constructed. Depending on the bandgap energy of the semiconductor, the micro-LEDs may emit red, blue, green, yellow or white light, for example. White light may be created by color mixing red, blue and green light or by wavelength conversion with phosphor.

It should be understood that while a certain form of this invention has been illustrated and described, it is not limited thereto except insofar as such limitations are included in the following claims.

Having thus described the invention, what is claimed as new and desired to be secured by Letters Patent is:

1. An AC/DC lamp comprising:
   an integrated array of series connected micro-LEDs having a direction of current flow and presenting positive and negative terminals, each of said micro-LEDs having an active region between a p-type semiconductor and a n-type semiconductor,
   said array of series connected micro-LEDs grown on a substrate,
   said terminals adapted to be connected across a power source to energize said array of series connected micro-LEDs, and
   said array being included in a package formerly designed for use for a standard-sized LED thus enabling said array to function as an indicator lamp.

2. The AC/DC lamp as set forth in claim 1 wherein said power source includes a power source selected from the group consisting of 12 volts DC, 24 volts DC, 36 volts DC, 48 volts DC, 110 volts AC, 120 volts AC, 220 volts AC and 240 volts AC.

3. The AC/DC lamp as set forth in claim 1 wherein said micro-LEDs are isolated from each other by etched trenches, and wherein said trenches are filled with polymer, oxides, nitrides or other insulation materials to achieve a generally flat top surface.

4. The AC/DC lamp as set forth in claim 1 wherein said micro-LEDs include etched trenches and sidewalls, said sidewalls coated with an insulation material.

5. The AC/DC lamp as set forth in claim 4 wherein said insulation material includes an insulation material selected from the group consisting of silicon oxide, silicon nitride, oxides, nitrides and polymides.

6. The AC/DC lamp as set forth in claim 4 wherein said sidewalls have a slope to enhance light extraction and conformal deposition of insulation material and interconnection metal wire.

7. The high voltage AC/DC lamp as set forth in claim 1 further comprising a second array of series connected micro-LEDs grown on said substrate and connected in series or parallel to said array of series connected micro-LEDs.

8. The high voltage AC/DC lamp as set forth in claim 1 wherein said substrate is an insulating substrate and includes a substrate material selected from the group consisting of sapphire, aluminum nitride, silicon carbide, silicon, gallium nitride, gallium arsenide and indium phosphide.

9. The AC/DC lamp as set forth in claim 1 wherein said substrate is a conducting or semi-conducting substrate and includes a substrate material selected from the group consisting of silicon carbide, silicon, gallium nitride, gallium arsenide and indium phosphide.

10. The AC/DC lamp as set forth in claim 1 further comprising an insulating layer between said substrate and said n-type semiconductor.

11. The AC/DC lamp as set forth in claim 10 wherein said insulating layer selected from the group consisting of aluminum nitride, aluminum gallium nitride, and aluminum indium gallium nitride.

12. The high AC/DC lamp as set forth in claim 10 further comprising a buffer layer between said insulating layer and said substrate.

13. The AC/DC lamp as set forth in claim 12 wherein said buffer layer has a thickness between 0 and 10 µm.

14. The AC/DC lamp as set forth in claim 1 wherein said micro-LEDs are based on semiconductors selected from the group consisting of AlInGaN, AlInGaP and AlGaAs.

15. The AC/DC lamp as set forth in claim 1 further comprising a package for housing said array.

16. The AC/DC lamp as set forth in claim 15 wherein said package includes a package selected from the group consisting of T1, T1-¾ and T3-¼ having lens size diameters of 3 mm, 5 mm, and 10 mm respectively.

17. The AC/DC lamp as set forth in claim 16 further comprising a plurality of said indicator lamps connected in parallel.

18. The AC/DC lamp as set forth in claim 17 wherein said indicator lamps emit the same or different colors.

19. The AC/DC lamp as set forth in claim 15 wherein said package is a surface mount package.

20. The AC/DC lamp as set forth in claim 1 wherein said array of micro-LEDs emit white light by wavelength conversion with phosphor.

21. The AC/DC lamp as set forth in claim 1 wherein said array of micro-LEDs emit white light by mixing red, blue and green light.

22. The AC/DC lamp as set forth in claim 1 wherein said array of micro-LEDs has a die size of less than approximately 1 millimeter by 1 millimeter.

23. An indicating lamp operable on a source of AC power, said lamp comprising:
   a first serially-connected array of micro-LEDs grown on a substrate;
   a second serially-connected array of micro-LEDs grown on said a substrate;
   said first array being connected in parallel with said second array;
   said second array being arranged such that it has a reversed current flow direction relative to said first array so that when said lamp is operated using said source of AC power illumination is sustained regardless of current cycle; and
   said indicator lamp being fittable into a package formerly designed for use for a standard-sized LED.

24. An AC lamp comprising:
   an integrated array of series connected micro-LEDs;
   said micro-LEDs being multiple times smaller than a conventional 300 micron by 300 micron LED and thus causing said array to have a size which enables a substitution of said array in a conventional use of said conventional 300 micron by 300 micron LED; and
   said array fitted into a standard-sized LED indicator lamp package.

* * * * *